United States Patent
Takahashi (12)

(10) Patent No.: US 6,898,142 B2
(45) Date of Patent: May 24, 2005

(54) SEMICONDUCTOR MEMORY, METHOD FOR CONTROLLING REFRESHMENT OF IT, AND METHOD FOR SETTING MEMORY CELL ARRAY SPECIFIC AREA FOR REALIZING THE CONTROL METHOD

(75) Inventor: Hiroyuki Takahashi, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 76 days.

(21) Appl. No.: 10/415,604

(22) PCT Filed: Oct. 23, 2001

(86) PCT No.: PCT/JP01/09296
§ 371 (c)(1),
(2), (4) Date: Apr. 30, 2003

(87) PCT Pub. No.: WO02/37501
PCT Pub. Date: May 10, 2002

(65) Prior Publication Data
US 2004/0032772 A1 Feb. 19, 2004

(30) Foreign Application Priority Data
Oct. 30, 2000 (JP) ........................................ 2000-331451

(51) Int. Cl.[7] ................................................. G11C 7/00
(52) U.S. Cl. ................... 365/222; 365/230.06; 365/229
(58) Field of Search ................................. 365/222, 233, 365/230.06, 230.08, 227, 229, 233.5

(56) References Cited

U.S. PATENT DOCUMENTS 6,028,805 A  2/2000  Higuchi
6,433,584 B1 * 8/2002  Hatae ........................... 326/80
6,449,204 B1 * 9/2002  Arimoto et al. ............. 365/222
6,501,300 B2 * 12/2002  Hatae ........................... 326/93
6,751,144 B2 * 6/2004  Takahashi et al. .......... 365/222

FOREIGN PATENT DOCUMENTS

| JP | 4-21992 | 1/1992 |
|---|---|---|
| JP | 6-36559 | 2/1994 |
| JP | 7-169268 | 7/1995 |
| JP | 2546161 | 8/1996 |
| JP | 11-213658 | 8/1999 |
| JP | 2000-21162 | 1/2000 |

* cited by examiner

*Primary Examiner*—Gene N. Auduong
(74) *Attorney, Agent, or Firm*—Choate, Hall & Stewart

(57) ABSTRACT

In accordance with the present invention, in order to reduce an averaged consumption current in a stand-by state, there is provided a semiconductor memory device including a memory cell array area which is divided into a plurality of areas, wherein the semiconductor memory device includes: at least one specific area setting unit being electrically coupled to said memory cell array area and adopted to set at least one area defined in said plurality of areas in accordance with an optional criterion; and at least one refresh operation control unit being electrically coupled to said memory cell array area and adopted to perform a refresh operation to the specific area based on at least one kind of specific refresh control signal, which is longer in cycle than a basic refresh control signal at least in a predetermined state of the semiconductor memory device.

66 Claims, 10 Drawing Sheets

FIG. 4

| A0 | A1 | P0/P1 | | | |
|---|---|---|---|---|---|
| | | 0/0 | 0/1 | 1/0 | 1/1 |
| 0 | 0 | B4 | B2 | B3 | B1 |
| 0 | 1 | B3 | B1 | B4 | B2 |
| 1 | 0 | B2 | B4 | B1 | B3 |
| 1 | 1 | B1 | B3 | B2 | B4 |

FIG. 7

| A0 | A1 | CS ||
| | | H (active) | L (stand-by) |
|---|---|---|---|
| 0 | 0 | data hold (short cycle) | data hold (long cycle) |
| 0 | 1 | data hold (short cycle) | data non-hold |
| 1 | 0 | data hold (short cycle) | data non-hold |
| 1 | 1 | data hold (short cycle) | data non-hold |

FIG. 10

| C3 | | cell array selecting signal activated in stand-by state | | | | | | | |
|---|---|---|---|---|---|---|---|---|---|
| | | B1 | | B3 | | B2 | | B4 | |
| | | X0/X1 | | | | | | | |
| (A0) | (A1) | 0/0 | | 0/1 | | 1/0 | | 1/1 | |
| 0 | 0 | 1 | 1 | 1 | 0 | 0 | 1 | 0 | 0 |
| 0 | 1 | 0 | 1 | 0 | 0 | 1 | 1 | 1 | 0 |
| 1 | 0 | 1 | 0 | 1 | 1 | 0 | 0 | 0 | 1 |
| 1 | 1 | 0 | 0 | 0 | 1 | 1 | 0 | 1 | 1 |
| | | P0 | P1 | P0 | P1 | P0 | P1 | P0 | P1 |

SEMICONDUCTOR MEMORY, METHOD FOR CONTROLLING REFRESHMENT OF IT, AND METHOD FOR SETTING MEMORY CELL ARRAY SPECIFIC AREA FOR REALIZING THE CONTROL METHOD

TECHNICAL FIELD

The present invention relates to a semiconductor memory device including a memory cell array which comprises a DRAM (a dynamic random access memory), and more particularly to a semiconductor memory device having an operation mode corresponding to a stand-by state, and a method of controlling a refresh operation thereof as well as a method of setting a memory cell array specific area for realizing the control method.

BACKGROUND OF THE ART

In recent years, a multi-functionality of portable device typically portable telephones, has been realized, and a necessary capacity of a RAM (a random access memory) for realizing the multi-functionality tends to be increased. For this reason, there has been generated a new need to use the DRAM suitable for realizing the large capacity, in place of a past-used SRAM (static random access memory) which is characterized by a small consumption current. In case of using the DRAM, a refresh operation is necessary for allowing the DRAM to bold data, wherein a particular issue is to reduce a refresh current in a stand-by state.

The refresh current in the DRAM is decided depending on a time interval of the refresh operations to each cell of the memory cell array which constitutes the DRAM, or depending on a refresh cycle. As the refresh cycle is long, then the refresh current is small. This refresh cycle is decided depending upon a cell having a worst hold characteristic (a worst bit cell) in plural memory cells which constitute the memory cell array. The refresh cycle is adjusted to be shorter than a hold time of the worst bit cell, so as to allow the worst bit cell to hold data.

FIG. 1 is a diagram illustrative of a distribution of the number of cells versus the bold time of the memory cells in the DRAM. A horizontal axis of a graph shown in FIG. 1 represents the hold time, while a vertical axis represents the number of memory cells. In general, in al of the memory cells, the number of cells with good hold times is much lager than cells with bad hold times. Hold times of a majority of the cell tend to be better or longer by at least one digit than the hold time of the worst bit cell. However, the refresh cycle is decided by the hold time of the worst bit cell as shown in the figure. This means that a larger averaged current than a necessary averaged current is applied to the majority of the cells in the refresh operation.

One example of conventional techniques for reducing unnecessary refresh currents to the majority of the cells as shown in FIG. 1 is described in Japanese patent No. 2546161 (Japanese laid-open patent publication No. 6-89571). The semiconductor memory device described in this publication is as follows. A hold characteristic is measured by a probing test to the DRAM in the form of a wafer in the fabrication processes. Based on this measured hold characteristic and for each row address, a refresh operation is taken place to cells with bad characteristics at a normal refresh cycle, while another refresh operation is taken place to other cells at a longer refresh cycle than the normal refresh cycle. A control circuit is provided for performing the refresh operations. Switching the above two different refresh cycles is made by supplying an externally supplied refresh signal to the circuit for refresh operation directly or after the refresh cycle is elongated through a counter. Setting either signal to be used is made by a programming which is made by cutting wirings provided for each row address by utilizing a laser in the fabrication processes, or based on data read out for the operations for each row address, wherein the data corresponds to the hold data and have previously been stored in a programmable ROM (read only memory) for each row address.

Meanwhile, in the portable device integrating the above-described semiconductor memory device, a classification of the method of holding data to be stored in the semiconductor memory device may be, in case, made in accordance with an operational specification. In case of the portable telephone, for example, important data are first stored into a flash memory, so that the important data are holed or secured independent from whether the semiconductor memory device is in the stand-by state or not. For example, telephone number data are very important, for which reason the data are stored into the flash memory without storing the date into the RAM (non-volatile memory). Applications of the RAM are, for example, classified into two. First one is a work area for holding, in a short term, data which are temporary used in a variety of processings of CPU (central processing unit). The CPU has a memory which has, however, an extremely small capacity. For this reason, it is necessary to use a partial area of the RAM. The remaining area thereof is used for storing data for a long term. In the stand-by state of the portable telephone, less external information is entered therein, but the CPU may, in case, process when user does not use the portable phone. For example, a calculation of fee or a communication to a base station may be made. Data to be used for those processes are stored in the memory area for the long term store, without causing the data to be disappeared in the stand-by state. If values of data remain unchanged during the stand-by state, then it may be considered to store the data into the flash memory. In the processes, it is preferable to store data into the RAM because an access to the flash memory is slow and takes much times.

Examples of conventional techniques for reducing the consumption current of the DRAM in the stand-by state in consideration of the above-described conditions in use of the device are described in Japanese laid-open patent publications Nos. 11-213658 and 2000-21162. In the semiconductor devices described in those publications, the memory cell array is divided into a plurality of areas, so that only a part of the memory cell array is refreshed without refreshing the entirety of the memory cell array. The memory cell array is divided into some memory areas, so that, for example, in two memory areas, only a memory area storing important informations is refreshed, and another memory area storing non-important informations is not refreshed. A value of RCB (refresh control bit) is externally designated in order to allow setting an area to be refreshed in the memory cell area.

In the conventional techniques described above, the refresh cycle may be switched for each row address in consideration of the hold characteristic. In this case, the increase in the memory capacity of the DRAM causes increase in scale of a switching circuit or a circuit for holding the data for the switch, and takes a longer time for read out the data, and further increases the consumption current for operating those circuits.

On the other hands, in accordance with the techniques described in Japanese laid-open patent publications Nos. 11-213658 and 2000-21162, the operation mode of the memory device is adopted for an operation mode of the device integrating the memory device without, however, taking into account the hold characteristic of the memory cells.

DISCLOSURE OF INVENTION

An object of the present invention is to solve the issues with the above-described conventional techniques and to provide a semiconductor memory device having an operation mode responding to a stand-by state, herein an averaged consumption current in the stand-by state is reduced as compared to the conventional one.

Accordingly, an object of the present invention is to provide a method of controlling a refresh operation of a semiconductor memory device having an operation mode responding to a stand-by state, for allowing the semiconductor memory device to reduce an averaged consumption current in the stand-by state as compared to the conventional one.

A further object of the present invention is to provide a method of setting a specfic area in a memory cell array for realizing the above control method.

In order to solve the above issues, the present invention provides a semiconductor memory device including a memory cell array area divided into a plurality of areas, wherein the semiconductor memory device further includes: at least one specific area setting unit being electrically coupled to the memory cell array area for setting at least one kind of specific area from the plurality of areas based on a criterion; and at least one refresh operation control unit being electrically coupled to the memory cell array area for refreshing the specific area based on at least one kind of specific refresh control signal having a longer cycle than a basic refresh control signal at least when the semiconductor memory device is in a predetermined state.

The basic refresh control signal is a refresh control signal generated by utilizing the conventional technique, while the specific refresh control signal is a refresh control signal generated by utilizing the present invention to be described below, and having a longer cycle than the basic refresh control signal and is supplied to at least one specific area determined in the plural memory areas based on a criterion.

The predetermined state may be a stand-by state, and in a non-stand-by state, the refresh operation control unit may refresh the at least one kind of specific area based on any one of the basic refresh control signal and the at least one kind of specific refresh control signal, and also may refresh other area than the at least one kind of specific area based on the basic refresh control signal.

The predetermined state may be a stand-by state, and the refresh operation control unit may refresh, in the stand-by state, both the at least one kind of specific area and other area based on the first refresh control signal.

The specfic area setting unit may comprise: at least one programmable circuit for setting a value of at least one output signal through programming; and a specific area setting circuit being electrically coupled between the memory cell array area and the at least one programmable circuit for setting the at least one kind of specific area based on a value of an output signal from the at least one programmable circuit.

The programmable circuit may comprise a circuit having disconnectable fuses.

The programmable circuit may be adopted to set, through programming, the number of bits of the output signal in addition to the value of the output signal.

The specific area setting circuit may be adopted so that if predetermined significant bits of a first address signal for selecting the memory cells is within a first address area predetermined corresponding to the specfic area, then an access to the specific area is made by using bits of the first address signal except for the predetermined bits, and if the first address signal is outside of the first address area, then an access to other area than the specific area is made.

The refresh operation control circuit may further include: a refresh control circuit; and a timer circuit being electrically coupled to the refresh control circuit for selecting any one of plural clock signals different in cycle from each other, and supplying selected one to the refresh control circuit.

The timer circuit may be adopted to select any one of a first clock signal with a first cycle and a second clock signal with a second cycle longer than the first cycle, based on an externally entered chip select signal which indicates a stand-by state or a non-stand-by state, and supply selected one to the refresh control circuit.

The timer circuit may comprise: a high speed timer circuit for outputting a first clock signal; a low speed timer circuit for outputting a second clock signal; and a selecting circuit being electrically coupled to the high speed timer circuit and the low speed timer circuit for selecting and outputting any one of the first clock signal and the second clock signal based on the chip select signal.

The semiconductor memory device may further include: a specific address setting unit for making an activation in response to a predetermined signal, and setting a specific address area corresponding to at least one specific area, based on an address signal entered in an activated state.

The specific address area setting unit may comprise: a command judging circuit for judging whether an externally entered command corresponds to a predetermined command for setting a refresh address space; and an address register being electrically coupled to the command judging circuit and a refresh address generating circuit of the refresh operation control unit for supplying the refresh address generating circuit with a signal held based on a result of judgement by the command judging circuit as a signal designating an address space for holding data in the stand-by state.

The plurality of areas as divided may have a non-bank configuration, so that the specific area setting unit is provided commonly to the plurality of areas.

The plurality of areas as divided may have a bank configuration, so that the specific area setting unit is provided for each of a plurality of banks.

The criterion may be a criterion determined based on hold characteristics of memory cells.

All of the plurality of areas as divided may be used as memory cell areas.

In the plurality of areas as divided, at least one area with a bad hold characteristic may serve as a redundancy area and is not used as a memory cell area, and a remaining area may be used as a memory cell area.

In memory cells in the specific area, all of memory cells having worse hold characteristics than a predetermined criterion may be made into redundancy cells and may not serve as memory cells, and remaining cells may serve as memory cells.

The semiconductor memory device may further include an address conversion circuit being electrically coupled to the memory cell array area for converting a first address signal for selecting the memory cells into a second address signal corresponding to the specific area when the first address signal designates an address within a first address area predetermined corresponding to the specific area, and for converting the first address signal into a third address signal included in other area than the specific area when the first address signal designates an address outside the first address area.

The present invention further provides a semiconductor memory device including a memory cell array area divided into a plurality of areas, wherein the semiconductor memory device further includes: a refresh control signal generating circuit for generating a first refresh control signal and a second refresh control signal which has a longer cycle than the first refresh control signal; a specific area setting unit being electrically coupled to the memory cell array area for setting at least one specific area from the plurality of areas based on hold characteristics of memory cells; and a refresh operation control circuit being electrically coupled to the memory cell array area for refreshing the specific area based on the second refresh control signal at least when the semiconductor memory device is in a stand-by state.

In a non-stand-by state, the refresh operation control unit may be adopted to refresh the specific area based on any one of the first refresh control signal and the second refresh control signal, and also refreshes other area than the specific area based on the first refresh control signal.

The refresh operation control unit may be adopted to refresh, in the stand-by state, both the specific area and other area based on the first refresh control signal.

The specific area setting unit may comprise: a programmable circuit for setting a value of at least one output signal through programming; and a specific area setting circuit being electrically coupled between the memory cell array area and the programmable circuit for setting the specific area based on a value of an output signal from the programmable circuit.

The programmable circuit may comprise a circuit having disconnectable fuses.

The programmable circuit may be adopted to set, through programming, the number of bits of the output signal in addition to the value of the output signal.

The specific area setting circuit may be adopted to control an access, so that if predetermined significant bits of a first address signal for selecting the memory cells is within a first address area predetermined corresponding to the specific area, then an access to the specific area is made by using bits of the first address signal except for the predetermined bits, and if the first address signal is outside of the first address area, then an access to other area than the specific area is made.

The fresh operation control circuit may further include: a refresh control circuit; and a timer circuit being electrically coupled to the refresh control circuit for selecting any one of a first clock signal with a first cycle and a second clock signal with a second cycle longer than the first cycle, based on an externally entered chip select signal which indicates a stand-by state or a non-stand-by state, and supplying selected one to the refresh control circuit.

The timer circuit may comprise: a high speed timer circuit for outputting a fist clock signal; a low speed timer circuit for outputting a second clock signal; and a selecting circuit being electrically coupled to the high speed timer circuit and the low speed timer circuit for selecting and outputting any one of the first clock signal and the second clock signal based on the chip select signal.

The semiconductor memory device may further include: a specific address setting unit for making an activation in response to a predetermined signal, and setting a specific address area corresponding to at least one specific area, based on an address signal entered in an activated state.

The specific address area setting unit may comprise: a command judging circuit for judging whether an externally entered command corresponds to a predetermined command for setting a refresh address space; and an address register being electrically coupled to the command judging circuit and a refresh address generating circuit of the refresh operation control circuit for supplying the refresh address generating circuit with a signal held based on a result of judgement by the command judging circuit as a signal designating an address space for holding data in the stand-by state.

The plurality of areas as divided may have a non-bank configuration, so that the specific area setting unit is provided commonly to the plurality of areas.

The plurality of areas as divided may have a bank configuration, so that the specific area setting unit is provided for each of a plurality of banks.

All of the plurality of areas as divided may be used as memory cell areas.

In the plurality of areas as divided, at least one area with a bad hold characteristic may serve as a redundancy area and may not be used as a memory cell area, and a remaining area may be used as a memory cell area.

In memory cells in the specific area, all of memory cells having worse hold characteristics than a predetermined criterion may be made into redundancy cells and may not serve as memory cells, and remaining cells may serve as memory cells.

The semiconductor memory device may further include an address conversion circuit being electrically coupled to the memory cell array area for converting a first address signal for selecting the memory cells into a second address signal corresponding to the specific area when the first address signal designates an address within a first address area predetermined corresponding to the specific area, and for converting the first address signal into a third address signal included in other area than the specific area when the first address signal designates an address outside the first address area.

The present invention fiber provides a semiconductor memory device including a memory cell array area divided into a plurality of areas, wherein the semiconductor memory device further includes a programmable circuit for allowing that based on a result of measurement to hold characteristics of memory cells, at least one area being good in the hold characteristic is set as a specific area from the plurality of areas.

The semiconductor memory device may further include a specific area setting circuit being electrically coupled between the memory cell array area and the programmable circuit for setting the specific area based on a value of an output signal from the programmable circuit.

The programmable circuit may comprise a circuit having disconnectable fuses.

The programmable circuit may be adopted to set, through programming, the number of bits of the output signal in addition to the value of the output signal.

The semiconductor memory device may further include an address conversion circuit being electrically coupled to the memory cell array area for converting a first address signal for selecting the memory cells into a second address signal corresponding to the spec area when the first address signal designates an address within a first address area predetermined corresponding to the specific area, and for converting the first address signal into a third address signal included in other area than the specific area when the first address signal designates an address outside the first address area.

The present invention further provides a semiconductor memory device including a memory cell array area divided into a plurality of areas, wherein the semiconductor memory device further includes: a refresh control circuit; and a timer circuit being electrically coupled to the refresh control circuit for selecting any one of a first clock signal with a first cycle and a second clock signal with a second cycle longer than the first cycle, based on an externally entered chip select signal which indicates a stand-by state or a non-stand-by state, and supplying selected one to the refresh control circuit.

The timer circuit may comprise: a high speed timer circuit for outputting a first clock signal; a low speed timer circuit for outputting a second clock signal; and a selecting circuit being electrically coupled to the high speed timer circuit and the low speed timer circuit for selecting and outputting any one of the first clock signal and the second clock signal based on the chip select signal.

The present invention further provides a semiconductor memory device including a memory cell array area divided into a plurality of areas, and the plurality of areas divided including at least one specific area defined based on a criterion for hold characteristics of memory cells, wherein the semiconductor memory device further includes: an address conversion circuit being electrically coupled to the memory cell array area for converting a first address signal for selecting the memory cells into a second address signal corresponding to the specific area when the first address signal designates an address within a first address area predetermined corresponding to the specific area, and for converting the first address signal into a third address signal included in other area than the specific area when the first address signal designates an address outside the first address area; and at least one refresh operation control unit being electrically coupled to the memory cell array area for refreshing the specific area based on at least one kind of specfic refresh control signal having a longer cycle than a basic refresh control signal at least when the semiconductor memory device is in a predetermined state.

The semiconductor memory device may integrate at least one specific area setting unit being electrically coupled to the memory cell array area for setting the at least one kind of specific area in the plurality of areas.

The at least one specific area determined based on a criterion of hold characteristics of memory cells may be an area set through at least one specfic area setting unit installed outside of the semiconductor memory device.

The semiconductor memory device may integrate: at least one programmable circuit for setting a value of at least one output signal through programming; and a specific area setting circuit being electrically coupled between the memory cell array area and the at least one programmable circuit for setting at least one specific area based on a value of an output signal from the programmable circuit.

The semiconductor memory device may integrate a specific area setting circuit for setting a value of at least one output signal through programming and for setting at least one kind of specific area based on a value of the output signal from at least one programmable circuit installed outside of the semiconductor memory device.

The present invention further provides a semiconductor memory device including a memory cell array area divided into a plurality of areas, and the plurality of areas divided including at least one specific area defined based on a criterion for hold characteristics of memory cells, wherein the semiconductor memory device further includes: a control circuit being electrically coupled to the memory cell array area for controlling an access, so that if predetermined significant bits of a first address signal for selecting the memory cells is within a first address area predetermined corresponding to the specific area, then an access to the specific area is made by using bits of the first address signal except for the predetermined bits, and if the first address signal is outside of the first address area, then an access to other area than the specific area is made; and at least one refresh operation control unit being electrically coupled to the memory cell array area for refreshing the sic area based on at least one kind of specific refresh control signal having a longer cycle than a basic refresh control signal at least when the semiconductor memory device is m a predetermined state.

The semiconductor memory device may integrate at least one specific area setting unit being electrically coupled to the memory cell array area for setting the at least one kind of specific area in the plurality of areas.

The at least one specific area determined based on a criterion of hold characteristics of memory cells may be an area set through at least one specific area setting unit installed outside of the semiconductor memory device.

The semiconductor memory device may integrate: at least one programmable circuit for setting a value of at least one output signal through programming; and a specific area setting circuit being electrically coupled between the memory cell array area and the at least one programmable circuit for setting at least one specific area based on a value of an output signal from the programmable circuit.

The semiconductor memory device may integrate a specific area setting circuit for setting a value of at least one output signal through programming and for setting at least one kind of specific area based on a value of the output signal from at least one programmable circuit installed outside of the semiconductor memory device.

The present invention further provides a method of setting at least one specific area in a plurality of areas, into which a memory cell array area of a semiconductor memory device is divided, based on hold characteristics of memory cells, wherein the method comprises the steps of: setting a value of at least one output signal through programming by use of a programmable circuit; and setting the specific area by supplying the output signal to a specific area setting circuit being electrically coupled between a memory cell array area and the programmable circuit.

The programming may be made by cutting fuses of the programmable circuit.

The programmable circuit may be programmed to set the number of bits of the output signal in addition to the value of the output signal.

An activation and an inactivation of a plurality of area selecting signals corresponding to the plurality of areas as divided may be made based on at least one significant bit of an address signal, to set at least one specific area, and an access to memory cells in the specific area as set may be made based on an address designated by remaining bits.

The present invention further provides a method of controlling a refresh operation of a semiconductor memory device including a memory cell array area divided into a plurality of areas, wherein if the semiconductor memory device is in a stand-by state, then at least one specific area defined in the plurality of areas, based on hold characteristics of memory cells is refreshed based on a second refresh control signal having a longer cycle than a first refresh control signal; and if the semiconductor memory device is in a non-stand-by state, then the specific area is refreshed based on any one of the first refresh control signal and the second refresh control signal, and other area than the specific area is refreshed based on the first refresh control signal.

In the stand-by state, both the specific area and other area may be refreshed based on the first refresh control signal.

The refresh operation may be controlled by selecting any one of a first clock signal with a first cycle and a second clock signal with a second cycle longer than the first cycle, based on an externally entered chip select signal which indicates a stand-by state or a non-stand-by state, and supplying selected one to the refresh control circuit.

The method of controlling may firer include the steps of: making an activation in response to a predetermined signal; and setting a specific address area corresponding to at least one specific area, based on an address signal entered in an activated state.

The step of setting the specific address area may include the steps of: judging whether an externally entered command corresponds to a predetermined command for setting a refresh address space; holding a signal designating an address space for holding data in the stand-by state, based on a result of judgement of the command; and setting a specific address area based on the data as held.

All of the plurality of areas as divided may be used as memory cell areas. In the plurality of areas as divided, at least one area with a bad hold characteristic may serve as a redundancy area and may not be used as memory cell area, and a remaining area may be used as a memory cell area.

In memory cells in the specific area, all of memory cells having worse hold characteristics than a predetermined criterion may be made into redundancy cells and may not serve as memory cells, and remaining cells may serve as memory cells.

A first address signal for selecting the memory cells may be converted into a second address signal corresponding to the specific area when the first address signal designates an address within a first address area predetermined corresponding to the specific area, and the first address signal may be converted into a third address signal included in other area than the specific area when the first address signal designates an address outside the first address area.

If predetermined significant bits of a first address signal for selecting the memory cells is within a first address area predetermined corresponding to the specific area, then an access to the specific area may be made by using bits of the first address signal except for the predetermined bits, and if the first address signal is outside of the first address area, then an access to other area than the specific area may be made.

BRIEF DESCRIPTIONS OF THE DRAWINGS

FIG. 4 is a table showing operations of the area setting circuit and the program circuit of FIG. 3.

FIG. 7 is a table showing operations of the semiconductor memory device of FIG. 2.

FIG. 10 is a table showing operations of the program circuit of FIG. 9.

THE BEST MODE FOR CARRYING OUT THE INVENTION

Figure 2:
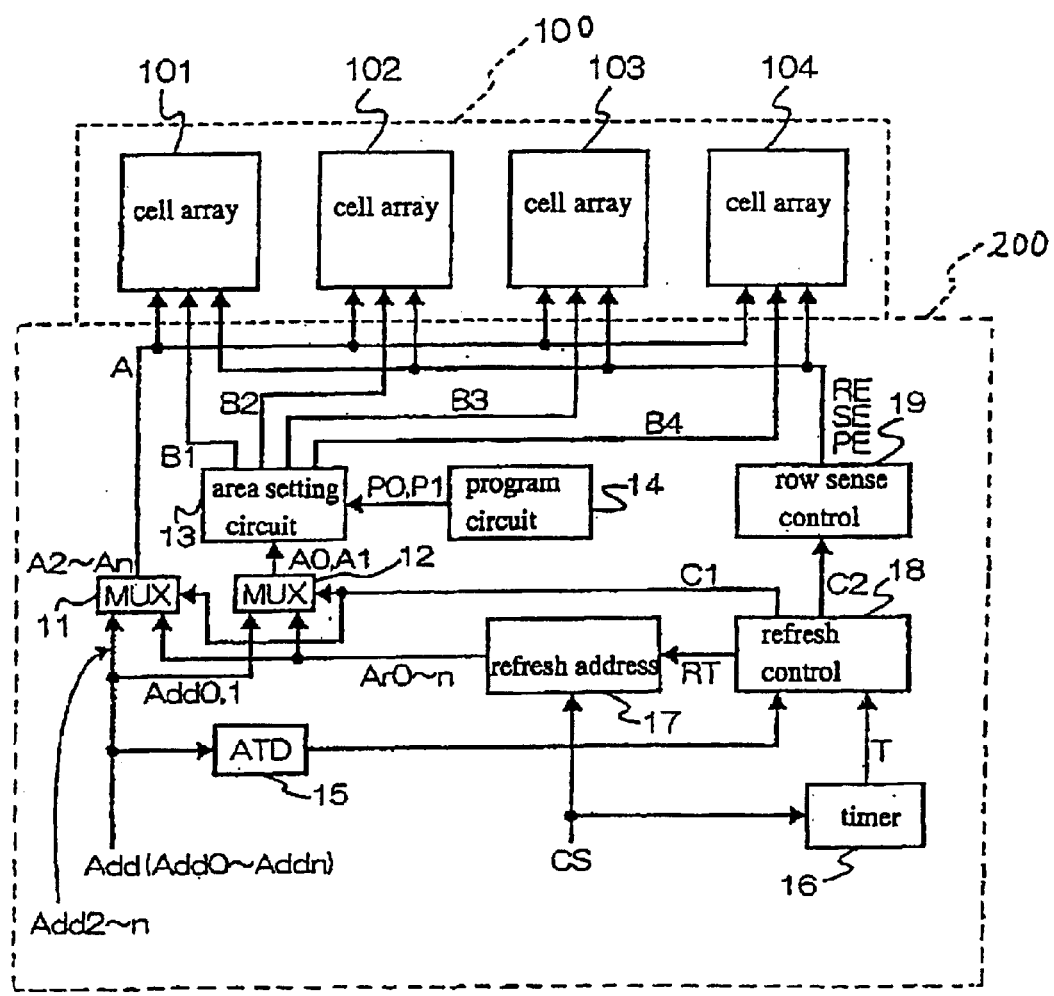
FIG. 2 is a block diagram showing a structure of a semiconductor memory device in an embodiment of the present invention.

An embodiment of the semiconductor memory device in accordance with the present invention will, hereinafter, be described with reference to the drawing FIG. 2 is a block diagram showing a structure of a semiconductor memory device in an embodiment of the present invention. The semiconductor memory device in accordance with the present invention includes a memory cell array area 100 and a circuit area 200. The memory cell array area 100 includes four divided cell arrays, for example, a first cell array 101, a second cell array 102, a third cell array 103, and a fourth cell array 104. The circuit area 200 includes a plurality of structural elements shown in the drawings for accesses to the above cell array areas 101, 102, 103 and 104, and other circuits not shown in the drawings such as a data bus, and an address latch circuit.

Each of the above cell array areas 101, 102, 103 and 104 has a plurality of DRAM cells, row decoders, column decoders, sense amplifier reset circuits, boost power sources, substrate voltage generating circuits and reference voltage generating circuits, each of which is connected to each of the DRAM cells, so that through the sense amplifiers, data on a data bus not illustrated are stored in a memory cell designated by an address "A" and cell array selecting signals B1~B4, and the stored data are read out and transmitted to the data bus, and the designated memory cell is refreshed In this case, the boost power source, the substrate voltage generating circuit and the reference voltage generating circuit are provided for each of the cell array areas 101, 102, 103 and 104, wherein they are operated only when corresponding one of the cell array selecting signals B1~B4 is active. Notwithstanding, those circuits may be provided commonly to all of the cell array areas 101, 102, 103 and 104.

Each constitutional element of the cell array areas 101, 102, 103 and 104 is the same as the constitutional element of the conventional DRAM cell. Each DRAM cell comprises a single transistor and a single capacitor. The DRAM cells are aligned in matrix and positioned at crossing points of plural word lines and bit lines (or bit line pairs) extending in a row direction and a column direction, respectively. The row decoder decodes a row address included in an address "A" when an active row enable signal "RE" is supplied from a row sense controller 19, and activates a word line designated by the decoded result. The column decoder decodes a column address included in the address "A", and generates a column selecting signal which is to select a bit line designated by the decoded result. The sense amplifier reset circuit comprises a sense amplifier column switch and a pre-charge circuit. The column switch provides a connection between a sense amplifier designated by the column selecting signal outputted from the column decoder and the data bus. The sense amplifier senses and amplifies a potential of a bit line connected with a memory cell designated by the address "A" and supplies the sensed and amplified potential to the data bus, or supplies write data on the data bus through the bit line to the memory cell and stores the data into the memory cell, when a sense enable signal "SE" is active. The reset circuit pre-charges a potential of the bit line to a predetermined potential (for example, one half of the power potential) when a pre-charge enable signal "PE" is active.

The boost power source, the substrate voltage generating circuit and the reference voltage generating circuit which are provided for each of the cell array areas 101, 102, 103 and 104 have the following functions.

The boost power source supplies the row decoder with a boosted voltage to apply the boosted voltage to a word line connected with each memory cell. The substrate voltage generating circuit generates a substrate voltage which is to be applied to a cell or a semiconductor substrate, on which each memory cell is formed. The reference voltage generating circuit generates a reference voltage (for example, one half of the power potential=½ Vcc) that is used by the memory cell array, the sense amplifiers in the sense amplifier reset circuit, the pre-charge circuit and an equalizer circuit.

A first multiplexer 11 and a second multiplexer 12 select any one of an access address Add of +1-bit supplied from an exterior of the semiconductor memory device and refresh addresses Ar0~Arn of +1-bit generated by a refresh address generating circuit 17, based on a control signal C1 outputted from a refresh control 18, and output an address "A" (A2~n) of (n−1)-bit which is to be supplied to the cell array areas 101, 102, 103 and 104, and an address "A0" or "A1" of 2-bits which is to be supplied to an area setting circuit 13. The first multiplexer 11 selects any one of an address Add2~Addn of lower order (n−1)-bits in the access address Add of +1-bit supplied from the exterior of the semiconductor memory device and an address Ar2~Arn of lower order (n−1)-bits in the refresh addresses Ar0~Arn of +1-bit generated by the refresh address generating circuit 17, and outputs the address "A" (A2~n) of (n−1)-bit which is to be supplied to the cell array 100. The second multiplexer 12 selects, based on the control signal C1, any one of an address Add0, Add1 of higher order 2-bits in the access address Add and an address Ar0~Ar1 of higher order 2-bits in the refresh addresses Ar0~Arn and outputs the address "A0" or "A1".

The area setting circuit 12 selects any one of the cell array selecting signals B1~B4, based on the address signal A0, A1 of 2-bits, and activates the selected signal. The method of selecting the cell array selecting signals B1~B4 based on the address signal A0, A1 is set according to a program of a program circuit 14. Examples of configurations of the area setting circuit 13 and the program circuit 14 will be described with reference to FIG. 3.

Figure 3:
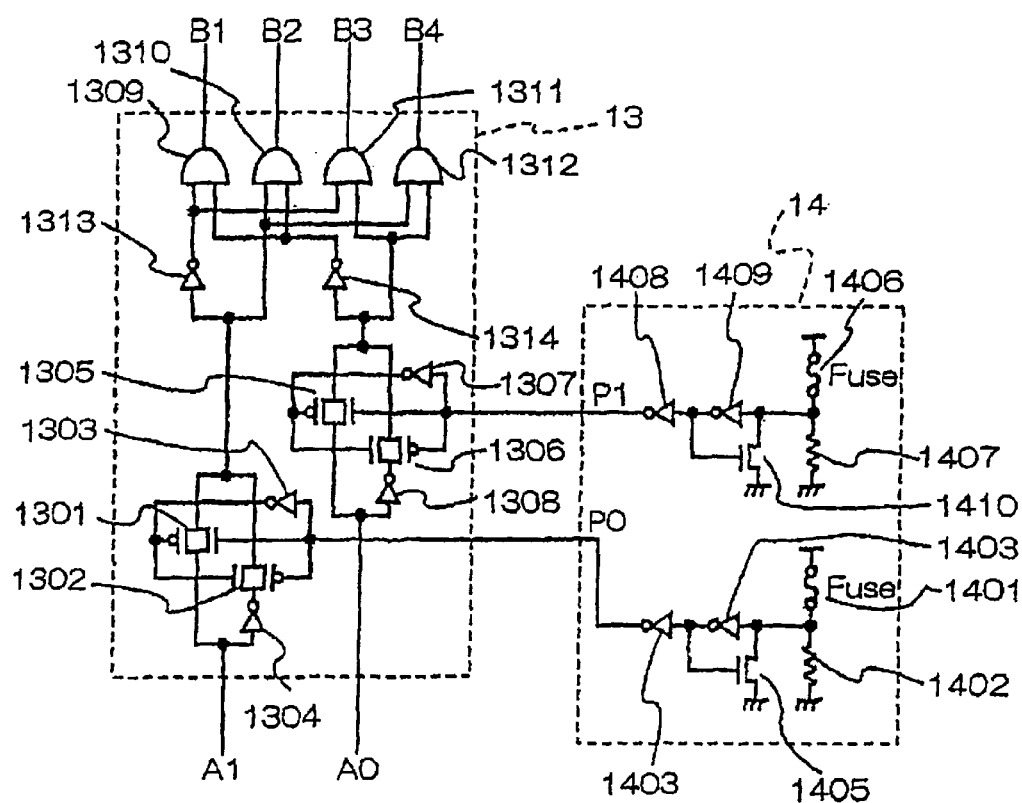
FIG. 3 is a circuit diagram showing structures in details of an area setting circuit and a program circuit.

The area setting circuit shown in FIG. 3 includes a first selector circuit, which comprises transfer gates 1301 and 1302 and an inverter 1303, and a second selector circuit, which comprises transfer gates 1305 and 1306 and an inverter 1307. Each of the above transfer gates 1301, 1302, 1305 and 1306 comprises a single pair of a p-MOS transistor and an n-MOS transistor. The first selector circuit selects and outputs any one of a signal A1 and an inversion signal, to which the signal A1 is inverted by the inverter 1304, based on an output P0 from the program circuit 14. The second selector circuit selects and outputs any one of a signal A0 and an inversion signal, to which the signal A0 is inverted by the inverter 1308, based on the output P0 from the program circuit 14. An output from the first selector circuit is inputted directly to 2-inputs-ANDs 1310 and 1312, and also inputted through an inverter 1312 to 2-inputs-ANDs 1309 and 1311. An output from the second selector circuit is inputted directly to 2-inputs-ANDs 1311 and 1312, and also inputted through an inverter 1314 to 2-inputs-ANDs 1309 and 1310.

Upon inputs of the address signals A0, A1, any one of the memory cell array selecting signals B1, B2, B3 and B4 outputted from the 2-inputs ANDs 1309, 1310, 1311 and 1312 is selected and activated. In this case, setting the address signals A0, A1 and the selected memory cell array selecting signals B1, B2, B3 and B4 is made based on values of the output signals P0, P1 from the program circuit 14 as shown in FIG. 4.

FIG. 4 is a table showing relationships of the address signals A0, A1, the output signals P0, P1 from the program circuit 14, and the memory cell array selecting signals B1, B2, B3 and B4. The columns describing B1~B4 represent that B1, B2, B3 and B4 become active. For example, In case that the address signals A0, A1 are (0,0), if P1=1, P0=1, then the memory cell array selecting signal B1 becomes active. If P1=1, P0=0, then the memory cell array selecting signal B2 becomes active. If P1=0, P0=1, then the memory cell array selecting signal B3 becomes active. If P1=0, P0=0, then the memory cell array selecting signal B4 becomes active. Namely, in case that the address signals A0, A1 are the same, the selected one of the cell array areas 101, 102, 103 and 104 is switched depending upon the signals P0, P1.

The program circuit 14 shown in FIG. 3 comprises a first program unit and a second program unit, wherein the first program unit comprises a fuse circuit 1401, a resistance circuit 1402, inverters 1403 and 1404 and a transistor 1405 and outputs a first output signal P0, while the second program unit comprises a fuse circuit 1406, a resistance circuit 1407, inverters 1408 and 1409 and a transistor 1410 and outputs a second output signal P1. The fuse circuits 1401 and 1406 are circuits which allow cutting by a laser or an excessive current (an excessive voltage) on a proving test in the manufacturing process, and comprise wirings, resistive elements, active elements such as transistors and diodes. If the fuse circuits 1401 and 1402 are not cut, then an input "1" i inputted into the inverters 1404 and 1409, and the outputs "P0" and "P1" are "1". If the fuse circuit 1401 is cut, then the output "P0" is "0". If the fuse circuit 1406 is cut, then the output "P1" is won. In accordance with the present invention, the states of the outputs P0 and P1 may be set optionally for the respective semiconductor memory device in the manufacturing processes thereof.

As described with the conventional techniques, if the portable telephone is in the stand-by state, it may be necessary to hold data of a partial area of a predetermined address area, but not an entire area of the memory cell array. In accordance with the requested specification of such the portable telephone, an area corresponding to one quarter of an entire area, where higher significant 2-bits of Add0 and Add1 of the external address Add become "0" is designated as an area for holding data in the stand-by state, and further the consumption current in the stand-by state is maintained lower than a predetermined value which is lower than the consumption current in the operational state (the non-standby state). As described with reference to FIG. 1, taking into account the manufacturing quality of the memory cells, it is the majority case that even if a partial area of the memory cells has a not-good hold characteristic, then the remaining majority area has the good holding characteristic. Namely, for example, in case that the memory cell area is divided into four areas, even if one or two areas have the bad holding characteristics, it is largely possible that all the memory cells in the remaining three or two areas satisfy the hold characteristic.

In the above-described present embodiment, the program circuit 14 is programmed to set any one area selected from the four memory cell array areas 101, 102, 103 and 104 as the memory area corresponding to the address Add0, Add1=0,0. Namely, an area which satisfies the required specifications for the hold characteristics is selected, depending upon an evaluation result of the hold characteristics of the memory cells in the manufacturing processes. Even if all of the four areas do not satisfy the required specifications for the hold characteristics, the semiconductor memory device may be considered to satisfy the required specifications for the hold characteristics in the stand-by states provided that at least one area satisfies the required specifications. This may improve the yield of the products as compared to the prior art, wherein the fixed cell array is a memory area corresponding to the address Add0, Add1=0,0.

The circuit of FIG. 2 will subsequently be described. An ATD (address transition detector) circuit 15 shown in FIG. 2 is a circuit for generating and outputting one-shot pulse signal (address transition detecting signal) when any change of any of the address Add (Add0~Addn) is caused.

Figure 5:
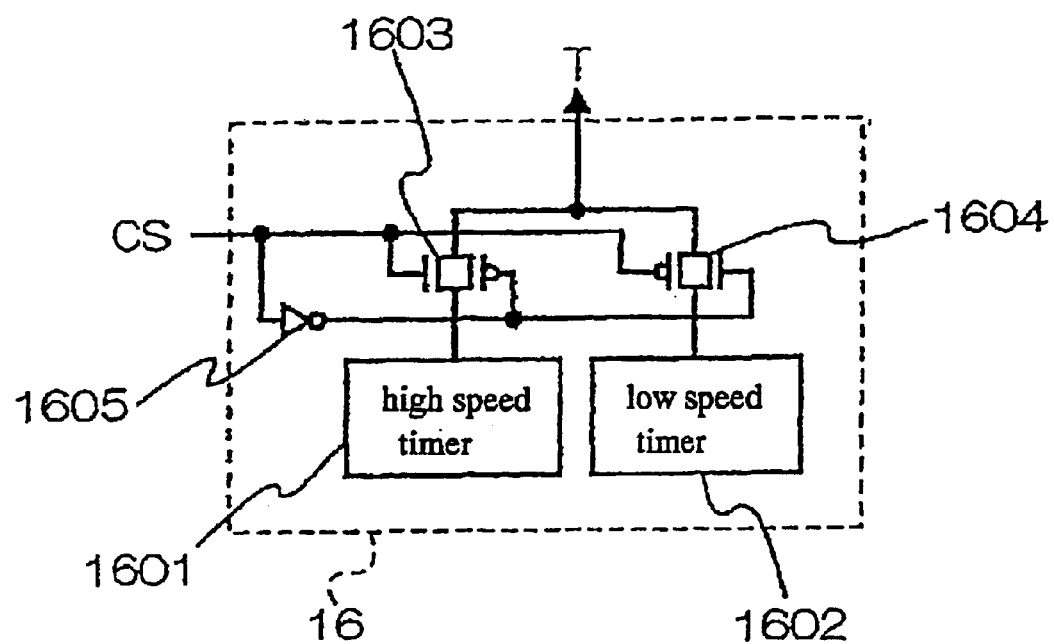
FIG. 5 is a circuit block diagram showing a structure in details of a timer shown in FIG. 2.

As shown in FIG. 5, the timer 16 comprises a high speed timer 1601 generating a clock signal with a relatively short cycle, a low speed timer 1602 generating a clock signal with a relatively long cycle, and a selector circuit for selecting any one of the outputs from the high speed timer 1601 and the low speed timer 1602, based on a chip select signal Cs and outputting the selected one as a signal "T". The selector circuit comprises a single pair of transfer gates 1603 and 1604 and an inverter 1605. The chip select signal Cs is a signal externally supplied, and activated (in this case becomes "1") in order to place the semiconductor memory device into an active mode (non-stand-by mode), and also inactivated (in this case becomes "0") in order to place the semiconductor memory device into a stand-by mode. In accordance with the configuration shown in FIG. 5, the timer 16 generates an output "T" of a clock signal with a short cycle if the chip select signal Cs is "1", and an output "T" of a clock signal with a long cycle if the chip select signal Cs is "0". In this case, the short cycle signal is so set as to be shorter than the hold time of the entire area, for example, the hold time of the worst bit in the example of FIG. 1.

A refresh controller 18 decides a timing of a refresh operation of the cell array areas 101, 102, 103 and 104, based on the address transition detecting signal supplied from the ATD 15 and a clock signal "T" supplied from the timer 16, and generates control signals C1, C2 for controlling the refresh operations and RT. Each refresh operation is made at a time of any transition of the address signal or another time when a passing time from the final external access to the semiconductor memory device exceeds a predetermined refresh time. A refresh timer for measuring the passing time in the refresh controller 18 is reset and starts a time-counting, every times the address transition detecting signal outputted from the ATD15 becomes effective.

The first control signal C1 is supplied to the multiplexers 11 and 12. Each of the multiplexers 11 and 12 selects the address signal based on the control signal C1. In the time period for the refresh operation, the address signal Ar0~Arn is selected, and in the other time period, the address signal Add0~Addn externally supplied is selected If the chip select signal Cs is "0", then the control signal C1 is controlled to be always C1="0". The second control signal C2 comprises a plurality of signals, and includes a time period and a timing of the refresh operations. The control signal RT is a clock signal which designates a switching timing of the address signal Ar0~Arn designating the memory cells. The control signal RT changed in synchronizing with the signal "T" outputted from the timer 16. A cycle of the control signal RT is short as the chip select signal Cs is "1" and long as the chip select signal Cs is "0".

Figure 6:
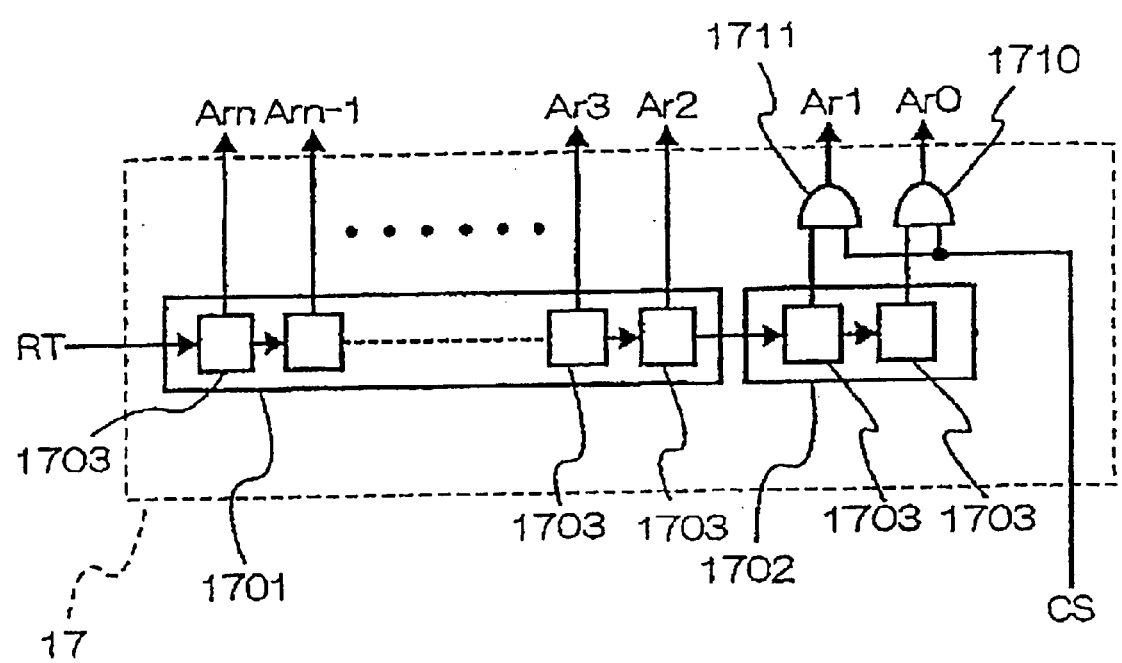
FIG. 6 is a circuit diagram showing a structure in details of a refresh address generating circuit shown in FIG. 2.

A refresh address generator (circuit) 17 is a circuit which generates a refresh address signal Ar0~Arn of +1-bits. The refresh address generator (circuit) 17 is configured as shown in FIG. 6. The refresh address generator (circuit) 17 shown in FIG. 6 comprises a lower order binary counter 1701 and a higher order binary counter 1702 connected in series to each other, and two 2-inputs-ANDs 1710 and 1711, wherein the lower order binary counter 1701 comprises (n−1) of 1-bit shift registers 1703, and the higher order binary counter 1702 comprises two of the 1-bit shift registers 1703, and the 2-inputs-ANDs 1710 and 1711 receive inputs of the outputs from the two of the 1-bit shift registers 1703 constituting the higher order binary counter 1702 and the chip select signal Cs. In this case, a total number of the 1-bit shift registers 1703 is (n+1). Each of the 1-bit shift registers 1703 operates as a binary counter of (n+1)-bits for counting up the number of clocks of the control signal RT, wherein the output from each of the 1-bit shift registers 1703 is counted up corresponding to the number of clocks if the control signal RT. In this case, outputs of the comprises (n−1) of 1-bit shift registers 1703 constituting the lower order binary counter 1701 provide the address signals Arn~Ar2 designating the memory cells to be refreshed. If the chip select signal Cs is "1", then ANDs 1711 and 1710 output the outputs from two of the 1-bit shift registers 1703 constituting the higher order binary counter 1702. For this reason, outputs from two of the 1-bit shift registers 1703 provide the address signals Ar1~Ar0. In accordance with this embodiment, the chip select signal Cs is "0" in the stand-by mode. In the stand-by mode, the address signals Ar1~Ar0 are already "0".

A row sense controller 19 is a circuit for generating, based on the control signal C2, a row enable signal "RE", a sense enable signal "SE" and a pre-charge enable signal "PE" necessary for the refresh. The row sense controller 19 generates one shot pulse to the row enable signal "RE" at a timing of rising of the address transition detecting signal generated upon the external access request during the time period of the refresh operation, or at a timing of self-refresh, thereby starting the refresh. The row sense controller 19 delays the row enable signal "RE" by a predetermined time to generate a sense amplifier enable signal "SE". The row sense controller 19 generates one shot pulse with a pulse width corresponding to a predetermined time from a rising edge of a signal delayed by a predetermined time from the row enable signal "RE", and outputs the same as the pre-charge enable signal "PE".

Subsequently, operations of the semiconductor memory device as configured above will be described.

In case that the chip select signal Cs is "1", then the semiconductor memory device operates in the active mode. In this mode, a destination of access is designated in the cell array areas 101, 102, 103 and 104, and a write enable signal instructing writing operation or an output enable signal instructing the read out operation is activated for performing the date store or read operation through a data bus. In this case, the clock signal with the skirt cycle as the signal "T" is outputted from the timer 16. The refresh operations to the cell array areas 101, 102, 103 and 104 is made at the short refresh cycle. Corresponding values of the refresh address signals Ar0~Arn to the cell array areas 101, 102, 103 and 104 are outputted from the refresh address generating circuit 17, whereby the data are held in all of the cell array areas 101, 102, 103 and 104.

In case that the chip select signal Cs is "0", then the semiconductor memory device operates in the stand-by mode. In this mode, the clock signal with the long cycle as the signal "T" is outputted from the timer 16. The signals Ar0, Ar1 generated from the refresh address generating circuit 17 become "0". In this case, the multiplexers 11 and 12 select the refresh address Ar, whereby Ar0, Ar1=A0, A1=0,0. For the refresh operation, the area selecting circuit 13 selects one cell array in the cell array areas 101, 102, 103 and 104, which corresponds to any one activated signal of the area selecting signals B1~B4 based on A0, A1=0,0, and on the outputs P0, P1 from the program circuit 14. The selected cell array is supplied with an address signal 2~An corresponding to the refresh address signal Ar2~Arn, and the refresh operation is made at the long refresh cycle. Data are held only in the selected one area of the cell array areas 101, 102, 103 and 104.

FIG. 7 shows states of holding data and variation of the refresh cycle in each area of the cell array areas 101, 102, 103 and 104 when the chip select signal Cs and values of the address signals A0, A1 are transitioned. In case that the chip select signal Cs is "1" (="H"; active mode), the address signals A0, A1 are changed in the range of 0,0~1,1. If the signals A0, A1 are "0,0", "0,1", "1,0", or "1,1", then one of the cell array areas 101, 102, 103 and 104 is selected as the access destination. In this case, all of the cell array areas 101, 102, 103 and 104 are refreshed at the short refresh cycle. In case that the chip select signal Cs is "0" (="L"; stand-by mode), only one cell array as set corresponding to the address A0, A1 in the cell array areas 101, 102, 103 and 104 is selected as an access destination, and the refresh operation is made at the long refresh cycle. The remaining three of the cell array areas 101, 102, 103 and 104 are not refreshed. Accordingly, data ar, held in only one cell array of the cell array areas 101, 102, 103 and 104 as set corresponding to the address A0, A1.

In accordance with the above configuration, in the active mode where the chip select signal Cs is "1", all of the cell array areas 101, 102, 103 and 104 are refreshed at the short refresh cycle. Notwithstanding, it is possible that in the active mode, the area as set for holding data in the stand-by state is refreshed at the long refresh cycle.

As described above, in accordance with the present invention, there is provided the area setting circuit 13 for switching correspondence relationships between the address A0, A1 for selecting the area and the cell array areas 101, 102, 103 and 104, whereby switching correspondence relationships between an area recognized from the exterior and an area with the internal access is made depending upon whether the address A0, A1 passes through the area setting circuit 13 or inverted. For example, if the area, to which the access is made at the external address Add0, Add1=0,0, is an area for holding data in the stand-by state, the program circuit 14 may be set so that the area, to which the access is made at Add0, Add1=0,0, is an area with a good holding characteristic in the cell array areas 101, 102, 103 and 104. Namely, the programming may be made so that the memory area externally designated at Add0, Add1=0,0, is an area with the good hold characteristic in the four areas, whereby the refresh cycle of the product becomes long and the stand-by current as the consumption current in the stand-by state is reduced.

For setting the switching method in the area setting circuit 13, it is necessary to determine the area with the good hold characteristic and the area with the bad hold characteristic This determination is made in the process for evaluating the wafer. The program circuit 14 is provided in the semiconductor memory device for holding the data obtained from the evaluation result, so that the programming to the program circuit 14 is made for each chip. For this programming (data storing), the same circuit may be used as the fuse circuit used in the redundancy circuit for rescuing the defective cells.

In accordance with the embodiment, in addition to the programming to the program circuit based on the evaluation result of the hold characteristic, the refresh cycle may be changed or switched. This programming allows that in the stand-by mode for holding data of a part of the memory cell arrays, the sufficiently long refresh cycle for holding the data in the area with the good hold characteristic is used. However, in the mode for holding the data of the entire memory cell arrays, it is necessary to refresh the area including cells with the bad hold characteristic rather than the area including cells with the good hold characteristic, for which reason the refresh cycle for holding the data of the area with the best hold characteristic is not directly usable. Thus, switching the refresh cycle is made depending upon the modes.

In accordance with the embodiment, the area with the good hold characteristic is selectable as an area for holding the data in the stand-by state. In the stand-by state, only the selected area is refreshed at a longer refresh cycle than the refresh cycle to be used for refreshing the entirety of the memory cell arrays. It is preferable to set the long refresh cycle and the short refresh cycle after measurement of the relationship between the refresh cycle for refreshing only the area with the best hold characteristic and the refresh cycle for refreshing the entirety of the memory cell array is made in the manufacturing test of the semiconductor memory device, and the hold times are set properly based on the measured results. If presumption may be made, it is possible that the refresh cycle for refreshing only the area with the best hold characteristic is set at fixed values, for example, two times, four times, or eight times of the refresh cycle for refreshing the entirety of the memory cell array.

The memory allowing the refresh to be controlled externally has the fixed refresh cycle. The semiconductor memory device such as a pseudo SRAM in the present embodiment performing a self-refresh has the timer. The cycle of operation of the timer may be adjustable by trimming at the time of making the evaluation on wafer. The value of the timer may be adjustable by truing, depending upon the performance of the product or the hold time.

In accordance with this embodiment, the are for holding data in the stand-by state is fixed to be the specific area (in the address area) which is specified externally. By contrast, for allowing the semiconductor memory device to be used in a system side, the specification of the semiconductor memory device does not designate any area for holding the data in the stand-by state in the plurality of areas. However, assuming that an area is suitable for holding data, it is possible to do the control for suing this area in the system side, which may be presumed to be more complicated as compared to the external control. In order to allow the system side to determine an area with the good hold characteristic, the data storing and later data reading are necessary. This test makes increased load to the system side. In accordance with the embodiment, for convenience on making the system, a predetermination is made to an area for storing important data from the system side.

For example, a large number of companies for the portable phone is present, it is possible that an area for holding the important data are different between the different portable phones. In this case, in accordance with the present embodiment, the specification for designating either an area of address Add0, Add1=0,0 or another area of address Add0, Add1=1,1 as the data holding area may optionally be changed by programming shown in FIG. 4.

Application of the semiconductor memory device of the present invention may include a method in use, wherein important data are stored in one area in a company "A", and another method in use, wherein important data are stored in one half area of the memory cell array, for example, addresses Add0, Add1=0,0 and 0,1 in a company "B". It may be requested that two areas with better hold characteristics in the four areas are used. In this case, as shown in FIG. 4, the above configuration allows optional setting of the relationship of the area and the external address for the four areas in order to respond to the request.

In accordance with the present embodiment, the memory cell array area 100 is divided into four. It is possible that the memory cell array area 100 is divided into eight, so that two areas with better hold characteristics are selected. This provides the same effects as when the memory cell array area 100 is divided into four, so that one area with good hold characteristic is selected. If the memory cell array area is divided into eight, the configurations of the area setting circuit 13 and the program circuit 14 are changed, so as to translate 2-bits signals into 3-bits selecting signals, and this translation is programmable.

As described above, if a plurality of areas with the good hold characteristics are selected, then there is a difference in the worst bit in the hold characteristics in the selected plurality of areas, for which reason there is a difference in maximum value of the refresh cycle deepening on the worst bits in the selected plurality of areas. In this case, it is possible to set a single kind of refresh cycle, in the stand-by state, commonly to the selected plurality of areas, depending upon minimum one of the maximum refresh cycles for the selected plurality of areas. It is also possible to set plural refresh cycles different from each other, in the stand-by state, for the selected plurality of areas, depending upon the maximum refresh cycles for the selected plurality of areas.

In the DRAM cell array, the cells with the bad hold characteristics are generated in not-random but regularly. For example, a side region of the memory cell array is likely to have cells with the bad hold characteristics due to variation on manufacturing. For example, the side region of the memory cell array is likely to have deformation and have cells with the bad hold characteristics. In such case, it is not preferable that the memory cell array area 100 is divided equally into four rectangle areas bounded to each other by two center lines in the row and column directions of the array, because the each divided area includes the side region. It may be possible to divide the memory cell array area 100 into four only in one of the row and column directions of the array, in order to reduce the side region.

The normal pseudo SRAM allows the refresh in a word line unit, so that a plurality of memory cells commonly connected to the single word line is batch-refreshed. Division of the memory cell array area 100 is not free but is somewhat restricted. Decision on the method of dividing the memory cells may preferably be made by presumption of the regularity of appearance the cells with the bad hold characteristics, and also taking into account the circuit configuration for refresh. In view of this, a non-square shape of the divided area is preferable. It is preferable that the division of the area is made taking into account the regularity of appearance the cells with the bad hold characteristics. In this case, for the circuit configuration of the area setting circuit 13, it is effective that the range of the address translation is limited, so that, for example, the address translation is inhibited on the side region of the chip, and the programming is permitted only to the addresses of the inside area, so that any optional area may be selected and allocated to the predetermined address area, thereby reducing the circuit scale.

In accordance with the embodiment, the memory array area 100 is divided into four areas, so that in the active mode, all of the areas are accessible. It is also possible that the memory array area is divided into five areas, so that the best one in view of the hold characteristic is used for holding data, and the worst one in view of the hold characteristic is not used, taking into account the stand-by current. Namely, the plural cell arrays may be given with the redundancy.

If the memory cell array is divided into a plurality of banks, then the area setting circuit 13 is provided for each of the banks, so as to select optional four areas, wherein one area is selected for each bank, provided that the four banks have, in total, sixteen areas. In this case, the program circuit 14 may be provided for each bank, or commonly to a plurality of banks or all of the banks. If the program circuit 14 is provided for each bank, then the above configuration is applicable. If the program circuit 14 is provided commonly to a plurality of banks or all of the banks, the single program circuit 14 performs separate controls to selecting operations of the area setting circuits 13. For this reason, the single program circuit 14 is configured to output the corresponding number of sets of the control signals as the number of the area setting circuits 13, to which the single program circuit 14 is commonly connected.

In accordance with the above embodiment, all of the address signals and those inverted signals are replaced according to a relegation in the area setting circuit 13. The replacement is not limited to the above-described one, but any optional method may be made at any optional position, provided that the same function is performed. For example, after a 2-bits signal is decoded into signals for four lines, replacement to the post-decode signal lines may be made. In this case, the signal replacement is made but only in the specific area, and no replacement is made in the remaining areas.

It is also possible to make replacement using redundancy, so as to inhibit the use of all memory cells which have worse hold characteristics than a predetermined criterion for the hold characteristic in the memory cells included in the best area in view of the hold characteristics in the divided cell array areas. In this case, a further improvement in the hold characteristic of the best area in view of the hold characteristics can be obtained and a further longer refresh cycle is allowable. Replacement of the memory cells with the redundancy cells may be realized by the known method.

A modification to the embodiment of the present invention shown in FIG. 1 and described above will be described with reference to FIG. 9. The semiconductor memory device shown in FIG. 9 further includes additional elements, as compared to the configuration of FIG. 2, a command judging circuit 20 for judgment of an externally entered command, and an address register 21 supplying a program circuit 14*a* and a refresh generating circuit 17*a* with a signal stored based on the judgment result by the command judging circuit 20 as a signal C3 which designates an address space for holding the data in the stand-by state. The same structural elements in FIGS. 2 and 9 are given the same reference numbers.

Figure 1:
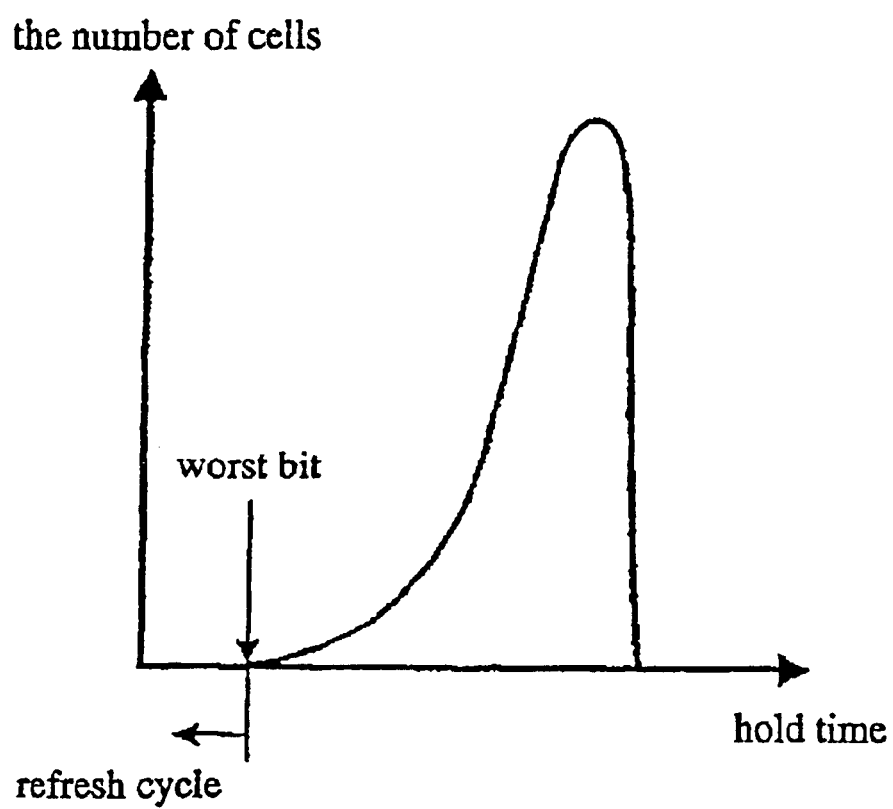
FIG. 1 is a view showing a distribution of the number of memory cells versus bold characteristics of the memory cells.
Figure 8:
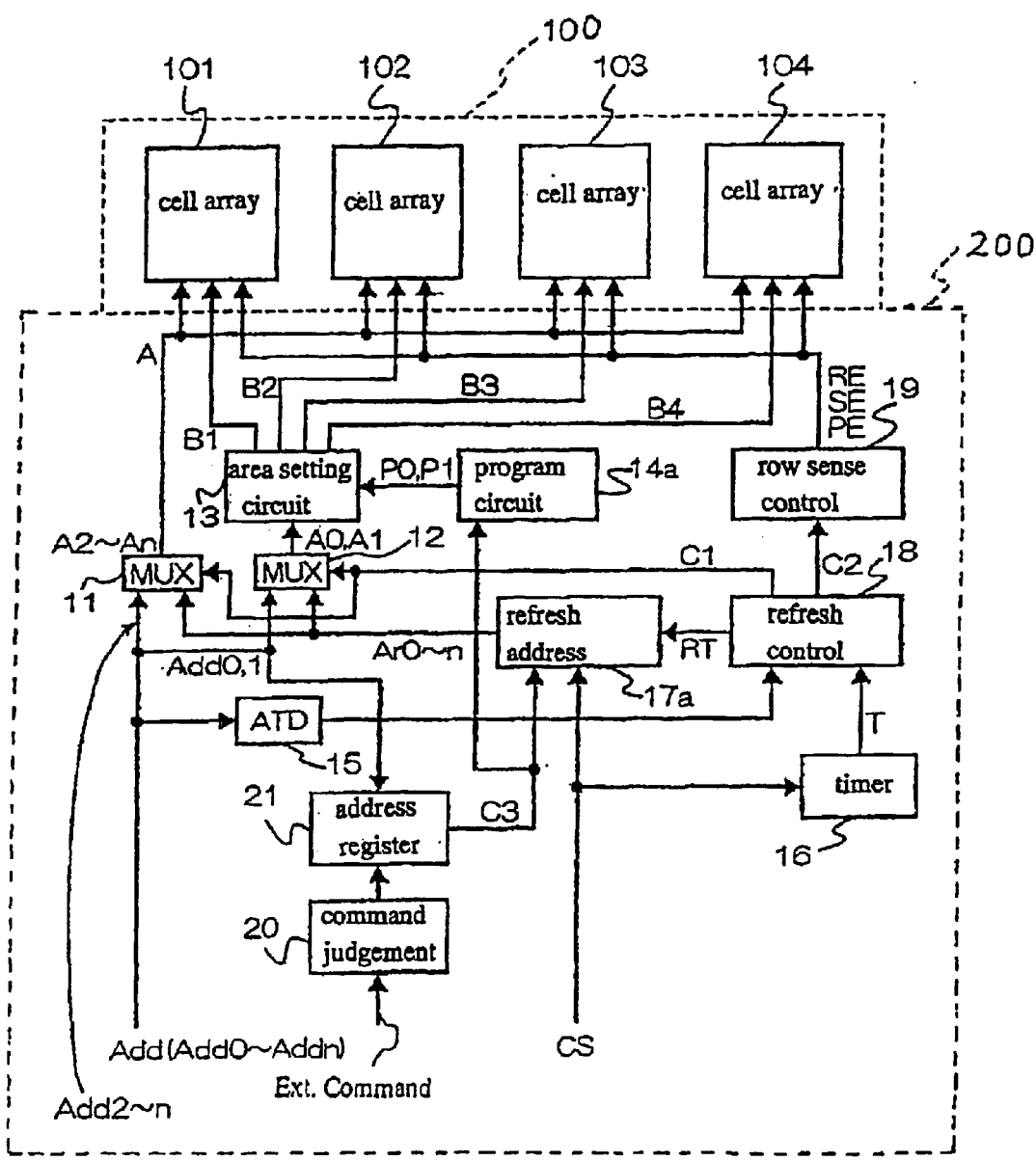
FIG. 8 is a block diagram showing a structure of a semiconductor memory device in another embodiment of the present invention.

In the embodiment shown in FIG. 1 and described above, the correspondence between the externally entered address and its internal address is pre-determined by fuses, for example, before the product shipment. In the modification shown in FIG. 8, in addition to the fuse circuit, there is used, as the address register 21, a memory means for storing the address space to be refreshed, and for example, an on-board non-volatile memory allowing data storing, or a volatile memory such as an SRAM (a flip-flop of CMOS (complementary metal oxide semiconductor) logic, and a DRAM. The user may previously store an address, to which the external address is to be translated, into the address register 21, so as to set an external address which corresponds to the area for holding data in the stand-by state. This increases the flexibility of the system design as compared to the configuration of FIG. 2. If the non-volatile memory such as the flash memory is used as the address register 21, if an information is once stored, then the stored information may be held even after the power off. If the volatile memory is used, it is necessary to set again the information every time the power-on because the once stored information becomes disappeared at the power-off. An amount of data to be set is not so large (for example, one of 2-bits data in this embodiment), then this process provide no large load to the system. For example, data to be set into the address register 21 may be also stored into the external flash memory, so that any software is used to transfer the data to RAM upon power-on, so as to re-produce the state before the power-off.

Figure 9:
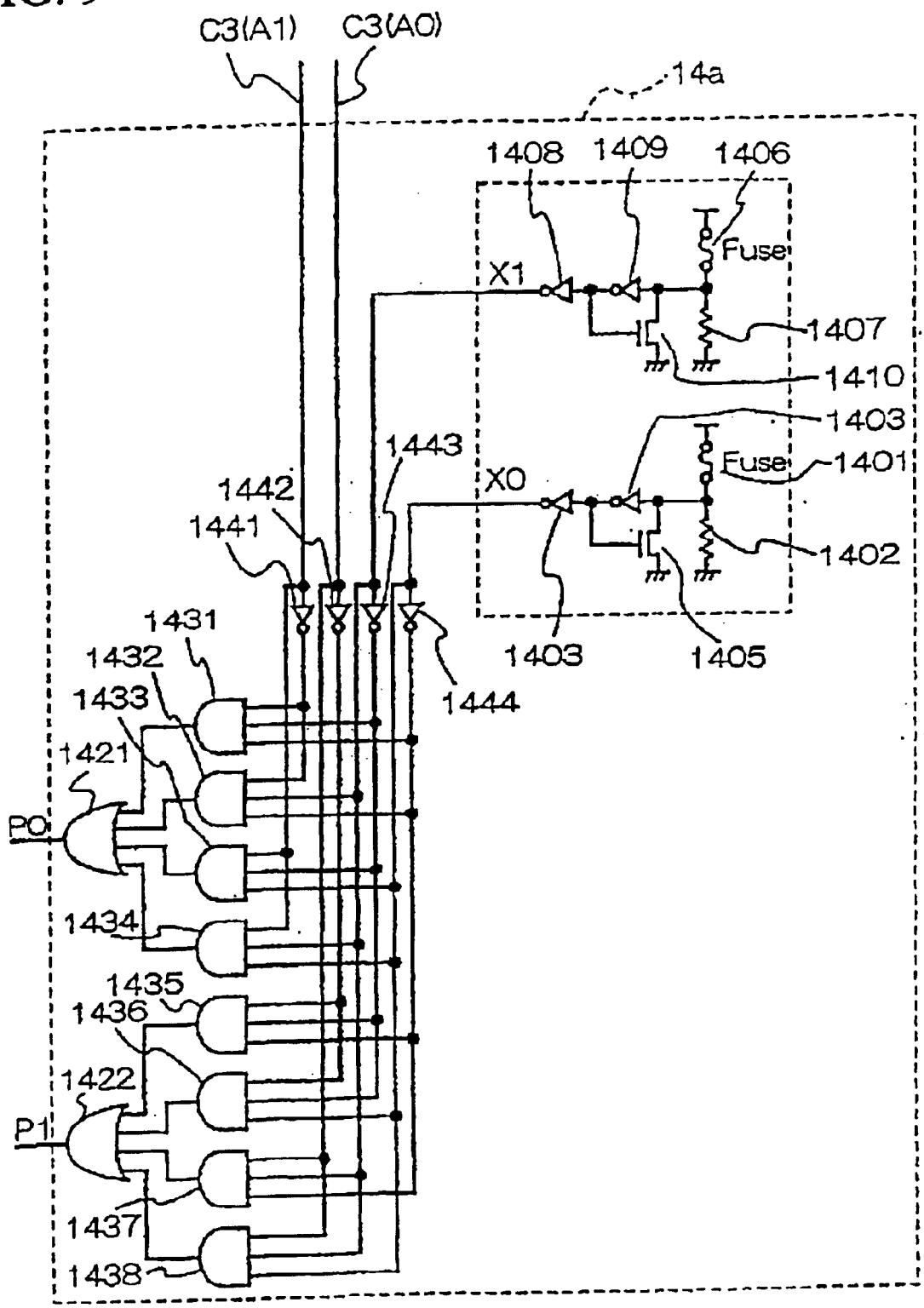
FIG. 9 is a circuit block diagram showing a structure in details of a program circuit shown in FIG. 8.

In FIG. 9, the command judgment circuit 20 is a circuit for judging whether or not the external command corresponds to a predetermined command for setting the refresh address space. The external command may be entered by using a dedicated input terminal (external pin) or utilizing the state-setting through combination of the existent terminals. The address register 21 comprises a non-volatile memory, and stores the address Add0, Add1 of the higher significant two bits of the access address Add if the command judgement circuit 20 judged that the command entry is made for setting the address space. The address register 21 holds the currently stored value until the command judgement circuit 20 judged the entry of the setting command. The address register 21 outputs the stored value (2-bits signal) as a signal C3, wherein values of the signal C3 corresponding bits to the address Add0, Add1 are C3(A0), C3(A1). The refresh address generating circuit 17*a* sets address values of two higher significant bits to be equal to values C3(A0), C3(A1) outputted from the address register 21, for generating the refresh address.

FIG. 10 is a circuit diagram showing an example of the configuration of the program circuit 14*a* shown in FIG. 9. In FIG. 10, the same structural elements as in the program circuit 14 shown in FIG. 3 are given the same reference number. In FIG. 10, the signals P1 and P0 are outputs from the program circuit 14 (inputs into the area setting circuits 13), while output signals from the inverters 1408 and 1403 are signals "X1" and "X0" respectively. In this case, the program circuit 14*a* is provided not only a circuit for generating the signals "X0" and "X1" for setting the cell array areas 101, 102, 103 and 104 to be refreshed in the stand-by state, but also a combination logic circuit for level-conversion of the signals "X0" and "X1" based on the C3(A0), C3(A1) outputted from the address register 21 to generate the outputs PC, P1. The combination logic circuit comprises two 4-inputs OR-circuits 1421, 1422 for outputting the signals P0, P1 respectively, eight of 3-inputs AND-circuits 1431~1438, and four inverters 1441~1444. The logical expression of the signal P0 is P0=/X0·/X1·/A1+/X0·X1·/A1+X0·/X1·A1+X0·X1·A1. The logical expression of the signal P1 is P0=/X0·/X1·/A0+/X0·X1·A0+X0·/X1·/A0+X0·X1·A0, where A0, A1 represent C3(A0), C3(A1), respectively.

FIG. 10 shows relationship between C3(A0), C3(A1) and X0, X1, and output signals P0, P1. FIG. 10 shows the relationships, based on the above logical expressions, between the signals X0, X1 and the refreshed one of the cell array areas 101, 102, 103 and 104 in the stand-by state (expressed in the cell array selecting signals B1~B4 in FIG. 10), and also shows the relationship between the signals X0, X1 and the outputs C3(A0), C3(A1) from the address register 21 and the output signals P0, P1. For refreshing the first cell array 101 (the signal B1) in the stand-by state, both the first circuits 1406 and 1401 are cut to set the signals X0, X1 to be 0,0. For refreshing the second cell array 102 (the signal 132) in the stand-by state, only the fuse circuit 1406 is cut to set the signals X0, X1 to be 1,0. For refreshing the third cell array 103 (the signal B3) in the stand-by state, only the fuse circuit 1401 is cut to set the signals X0, X1 to be 0,1. For refreshing the fourth cell array 104 (the signal B4) in the stand-by state, both the fuse circuits 1406 and 1401 are not cut to set the signals X0, X1 to be 1,1. After the signals X0, X1 have been set in any state, then the signals C3(A0), C3(A1) are outputted from the address register 21, whereby the outputs P0, P1 shown in FIG. 10 are outputted.

For example, the second cell array 102 (signal B2) is set in an area to be refreshed in the stand-by state, and further the access address Ad0, Add1=0,1 is set corresponding to the second cell array 102. In this case, the input signals are X0, X1=1,0, and C3(A0), C3(A1)=0,1. In this case, X0·/X1·A1 (the third term in the right side of P0)=1, X0·/X1·A0 (the third term in the right side of P1)=1. As shown in FIG. 10, the output signals P0, P1 are 1,1. As described above with reference to FIG. 4, in case of P0, P1=1,1, if the address A0, A1 corresponding to the access address Add0, Add1=0,1, then the cell array selecting signal B2 is selected. If the access address Add0, Add1=0,1, then the second cell array 102 is selected to receive an access, and if the chip select signal Cs is inactivated, then only the second cell array 102 is subject to the refresh In another example, the second cell array 102 (signal B2) is set to be an area subject to the refresh in the stand-by state, and further the access address Add0, Add1=1,1 is set corresponding to the second cell array 102. In this case, the input signals are X0, X1=1,0, and C3(A0), C3(A1)=1,1. In this case, the output signals P0, P1 are 1, 0 as shown in FIG. 10. As described above with reference to FIG. 4, in case of P0, P1=1,0, if the address A0, A1 is 1,1, then the cell array signal B2 is selected Thus, the access address A0, A1 is 1,1, then the second cell array 102 is selected to receive an access. If the chip selecting signal Cs is inactivated, then only the second cell array 102 is subject to the refresh.

As described above, in accordance with the configurations shown in FIGS. 9 and 10, any area is set as a refresh area in the stand-by state, and optional values of any access address Add0, Add1 corresponding to this area may be set externally. FIGS. 9 and 10 show one example of the embodiment Any design change may be allowable, for example, by taking another configuration using transfer gates instead of the above-described combination logic circuit.

In the above embodiment, the area setting circuit for setting the specific area is integrated in the semiconductor memory device. It is not necessary to integrate this circuit in the semiconductor memory device. It is possible that the specific area is set by programming to the program circuit provided outside of the semiconductor memory device.

Whereas the embodiments of the present invention have been described above, the present invention should not be limited to those embodiments, and any design change may be included in the present invention unless the change is beyond the subject matter of the present invention.

Industrial Applicability

In accordance with the present invention, the following effects can be obtained. In the semiconductor memory device having a plurality of dynamic memory cells and including the memory cell array divided into at least two areas, there are provided a refresh control signal generating means for generating a first refresh control signal and a second refresh control signal with a longer cycle than the first refresh control signal, a first setting means being programmable for setting, as a first area, an optional area decided in the plurality of areas based on the hold characteristic of the memory cell or for setting, as a first area, an optional area in the plurality of areas, and a refresh operation control means for refreshing the first area based on the second refresh control signal in the stand-by state. In the stand-by state, only the area with the good hold characteristic of the memory cells is subject to the refresh at the long refresh cycle according to the hold characteristic, thereby easily reducing an averaged consumption current in the stand-by state as compared to the prior art.

What is claimed is:

1. A semiconductor memory device including a memory cell array area divided into a plurality of areas,
   wherein said semiconductor memory device further includes:
   at least one programmable circuit for setting a value of at least one output signal through programming;
   at least one area setting unit being electrically coupled between said memory cell array area and said at least one programmable circuit for deciding an area corresponding to an address signal, which selects said memory cell, in accordance with an output signal from said programmable circuit and for setting at least one area from said plurality of areas based on said address signal; and
   at least one refresh operation control unit being electrically coupled to said memory cell array area for making said area setting unit to set a specific area in said plurality of areas and refreshing said specific area based on at least one kind of specific refresh control signal having a longer cycle than a basic refresh control signal at least when said semiconductor memory device is in a predetermined state.

2. The semiconductor memory device as claimed in claim 1, wherein said predetermined state is a stand-by state, and in a non-stand-by state, said refresh operation control unit refreshes said specific area as set in said stand-by state, based on any one of said basic refresh control signal and said specific refresh control signal, and also refreshes other area than said specific area as set in said stand-by state, based on said basic refresh control signal.

3. The semiconductor memory device as claimed in claim 1, wherein said predetermined state is a stand-by state, and said refresh operation control unit refreshes, in said stand-by state, both said at least one kind of specific area and other area based on said first refresh control signal.

4. The semiconductor memory device as claimed in claim 1, wherein said programmable circuit comprises a circuit having disconnectable fuses.

5. The semiconductor memory device as claimed in claim 1, wherein said programmable circuit is adopted to set, through programming, the number of bits of said output signal in addition to said value of said output signal.

6. The semiconductor memory device as claimed in claim 1, further including: a specific address setting unit for making an activation in response to a predetermined signal, and setting a specific address area corresponding to at least one specific area, based on an address signal entered in an activated state.

7. The semiconductor memory device as claimed in claim 6, wherein said specific address area setting unit comprises:
   a command judging circuit for judging whether an externally entered command corresponds to a predetermined command for setting a refresh address space; and
   an address register being electrically coupled to said command judging circuit and a refresh address generating circuit of said refresh operation control unit for supplying said refresh address generating circuit with a signal held based on a result of judgement by said command judging circuit as a signal designating an address space for holding data in said stand-by state.

8. The semiconductor memory device as claimed in claim 1, wherein said refresh operation control circuit further includes:
   a refresh control circuit; and
   a timer circuit being electrically coupled to said refresh control circuit for selecting any one of plural clock signals different in cycle from each other, and supplying selected one to said refresh control circuit.

9. The semiconductor memory device as claimed in claim 8, wherein said timer circuit selects any one of a first clock signal with a first cycle and a second clock signal with a second cycle longer than said first cycle, based on an externally entered chip select signal which indicates a stand-by state or a non-stand-by state, and supplying selected one to said refresh control circuit.

10. The semiconductor memory device as claimed in claim 9, wherein said timer circuit comprises:
    a high speed timer circuit for outputting a first clock signal;
    a low speed timer circuit for outputting a second clock signal; and
    a selecting circuit being electrically coupled to said high speed timer circuit and said low speed timer circuit for selecting and outputting any one of said first clock signal and said second clock signal based on said chip select signal.

11. The semiconductor memory device as claimed in claim 1, wherein said plurality of areas as divided have a non-bank configuration, and said specific area setting unit is provided commonly to said plurality of areas.

12. The semiconductor memory device as claimed in claim 1, wherein said plurality of areas as divided have a bank configuration, and said specific area setting unit is provided for each of a plurality of banks.

13. The semiconductor memory device as claimed in claim 1, wherein said specific area is an area determined based on hold characteristics of memory cells.

14. The semiconductor memory device as claimed in claim 13, wherein all of said plurality of areas as divided are used as memory cell areas.

15. The semiconductor memory device as claimed in claim 13, wherein in said plurality of areas as divided, at least one area with a bad hold characteristic serve as a redundancy area and is not used as a memory cell area, and a remaining area is used as a memory cell area.

16. The semiconductor memory device as claimed in claim 13, wherein in memory cells in said specific area, all of memory cells having worse hold characteristics than a predetermined criterion are made into redundancy cells and do not serve as memory cells, and remaining cells serve as memory cells.

17. A semiconductor memory device including a memory cell array area divided into a plurality of areas,
wherein said semiconductor memory device further includes:
a refresh control signal generating circuit for generating a first refresh control signal and a second refresh control signal which has a longer cycle than said first refresh control signal;
at least one programmable circuit for setting a value of at least one output signal through programming;
at least one area setting unit being electrically coupled between said memory cell array area and said at least one programmable circuit for deciding an area corresponding to an address signal, which selects said memory cell, in accordance with an output signal from said programmable circuit and for setting at least one area from said plurality of areas based on a predetermined bit number of said address signal; and
a refresh operation control circuit being electrically coupled to said memory cell array area for making said area setting unit to set said specific area in said plurality of areas and refreshing said specific area based on said second refresh control signal at least when said semiconductor memory device is in a stand-by state.

18. The semiconductor memory device as claimed in claim 17, wherein in a non-stand-by state, said refresh operation control circuit refreshes said specific area as set in said stand-by state, based on any one of said first refresh control signal and said second refresh control signal, and also refreshes other area than said specific area as set in said stand-by state, based on said first refresh control signal.

19. The semiconductor memory device as claimed in claim 17, wherein said refresh operation control unit refresh, in said stand-by state, both said specific area and other area based on said first refresh control signal.

20. The semiconductor memory device as claimed in claim 17, wherein said programmable circuit comprises a circuit having disconnectable fuses.

21. The semiconductor memory device as claimed in claim 17, wherein said programmable circuit is adopted to set, through programming, the number of bits of said output signal in addition to said value of said output signal.

22. The semiconductor memory device as claimed in claim 17, wherein said refresh operation control circuit further includes:
a refresh control circuit; and
a timer circuit being electrically coupled to said refresh control circuit for selecting any one of a first clock signal with a first cycle and a second clock signal with a second cycle longer than said first cycle, based on an externally entered chip select signal which indicates a stand-by state or a non-stand-by state, and supplying selected one to said refresh control circuit.

23. The semiconductor memory device as claimed in claim 22, wherein said timer circuit comprises:
a high speed timer circuit for outputting a first clock signal;
a low speed timer circuit for outputting a second clock signal; and
a selecting circuit being electrically coupled to said high speed timer circuit and said low speed timer circuit for selecting and outputting any one of said first clock signal and said second clock signal based on said chip select signal.

24. The semiconductor memory device as claimed in claim 17, further including: a specific address setting unit for making an activation in response to a predetermined signal, and setting a specific address area corresponding to at least one specific area, based on an address signal entered in an activated state.

25. The semiconductor memory deice as claimed in claim 24, wherein said specific address area setting unit comprises:
a command judging circuit for judging whether an externally entered command corresponds to a predetermined command for setting a refresh address space; and
an address register being electrically coupled to said command judging circuit and a refresh address generating circuit of said refresh operation control circuit for supplying said refresh address generating circuit with a signal held based on a result of judgement by said command judging circuit as a signal designating an address space for holding data in said stand-by state.

26. The semiconductor memory device as claimed in claim 17, wherein said plurality of areas as divided have a non-bank configuration, and said specific area setting unit is provided commonly to said plurality of areas.

27. The semiconductor memory device as claimed in claim 17, wherein said plurality of areas as divided have a bank configuration, and said specific area setting unit is provided for each of a plurality of banks.

28. The semiconductor memory device as claimed in claim 17, wherein all of said plurality of areas as divided are used as memory cell areas.

29. The semiconductor memory device as claimed in claim 17, wherein in said plurality of areas as divided, at least one area with a bad hold characteristic serve as a redundancy area and is not used as a memory cell area, and a remaining area is used as a memory cell area.

30. The semiconductor memory device as claimed in claim 17, wherein in memory cells in said specific area, all of memory cells having worse hold characteristics than a predetermined criterion are made into redundancy cells and do not serve as memory cells, and remaining cells serve as memory cells.

31. A semiconductor memory device including a memory cell array area divided into a plurality of areas, and said plurality of areas divided including at least one specific area defined based on a criterion for hold characteristics of memory cells,
wherein said semiconductor memory device further includes:
an address conversion circuit being electrically coupled to said memory cell array area for converting an address signal for selecting said memory cells into an internal address signal corresponding to any one of said plurality of areas, and when said address signal is a predetermined address signal corresponding to said specific area, said address conversion circuit converting said address signal into an internal address signal corresponding to said specific area; and
at least one refresh operation control unit being electrically coupled to said memory cell array area for refreshing said specific area, upon supply of said address signal corresponding to said specific area, based on at least one kind of specific refresh control signal having a longer cycle than a basic refresh control signal at least when said semiconductor memory device is in a predetermined state.

32. The semiconductor memory device as claimed in claim 31, wherein said semiconductor memory device integrates an area setting unit being electrically coupled to said memory cell array area for setting said at least one kind of area in said plurality of areas, based on said address signal and said internal address signal.

33. The semiconductor memory device as claimed in claim 31, wherein said specific area as determined based on a criterion of hold characteristics of memory cells is an area set through at least one specific area setting unit installed outside of said semiconductor memory device.

34. The semiconductor memory device as claimed in claim 31, wherein said semiconductor memory device integrates:
   at least one programmable circuit for setting a value of at least one output signal through programming; and
   an area setting circuit being electrically coupled between said memory cell array area and said at least one programmable circuit for setting at least one kind of area based on a value of said output signal from said programmable circuit.

35. The semiconductor memory device as claimed in claim 31, wherein said semiconductor memory device integrates an area setting circuit for setting a value of at least one output signal through programming and for setting at least one kind of area based on a value of said output signal from at least one programmable circuit installed outside of said semiconductor memory device.

36. A semiconductor memory device including a memory cell array area divided into a plurality of areas, and said plurality of areas divided including at least one specific area defined based on a criterion for hold characteristics of memory cells,
   wherein said semiconductor memory device further includes:
   a control circuit being electrically coupled to said memory cell array area for controlling an access, so that if predetermined higher significant bits of a first address signal for selecting said memory cells is within a first address area predetermined corresponding to said specific area, then an access to said specific area is made by using bits of said first address signal except for said predetermined bits, and if said first address signal is outside of said first address area, then an access to other area than said specific area is made; and
   at least one refresh operation control unit being electrically coupled to said memory cell array area for refreshing said specific area, upon supply of said first address signal being in said first address area corresponding to said specific area, based on at least one kind of specific refresh control signal having a longer cycle than a basic refresh control signal at least when said semiconductor memory device is in a predetermined state.

37. The semiconductor memory device as claimed in claim 36, wherein said semiconductor memory device integrates at least one specific area setting unit being electrically coupled to said memory cell array area for setting said at least one kind of specific area in said plurality of areas.

38. The semiconductor memory device as claimed in claim 36, wherein said at least one specific area determined based on a criterion of hold characteristics of memory cells is an area set through at least one specific area setting unit installed outside of said semiconductor memory device.

39. The semiconductor memory device as claimed in claim 36, wherein said semiconductor memory device integrates:
   at least one programmable circuit for setting a value of at least one output signal through programming; and
   a specific area setting unit being electrically coupled between said memory cell array area and said at least one programmable circuit for setting at least one specific area based on a value of an output signal from said programmable circuit.

40. The semiconductor memory device as claimed in claim 36, wherein said semiconductor memory device integrates a specific area setting unit for setting a value of at least one output signal through programming and for setting at least one kind of specific area based on a value of said output signal from at least one programmable circuit installed outside of said semiconductor memory device.

41. A method of controlling a refresh operation of a semiconductor memory device including a memory cell array area divided into a plurality of areas, said method including:
   converting an address signal, which selects a memory cell, into an internal address corresponding to any one specific area in said plurality of areas;
   refreshing said specific area, upon supply of an address signal corresponding to said specific area, based on a second refresh control signal having a longer cycle than a first refresh control signal if said semiconductor memory device is in a stand-by state; and
   refreshing said specific area based on any one of said first refresh control signal and said second refresh control signal if said address signal as supplied is an address signal corresponding to said specific area and if said semiconductor memory device is in a non-stand-by state, and also refreshing other area than said specific area based on said first refresh control signal, said address signal as supplied is an address signal corresponding to said other area than said specific area and if said semiconductor memory device is in a non-stand-by state.

42. The method of controlling a refresh operation as claimed in claim 41, wherein in said stand-by state, both said specific area and other area are refreshed based on said first refresh control signal.

43. The method of controlling as claimed in claim 41, wherein said refresh operation is controlled by selecting any one of a first clock signal with a first cycle and a second clock signal with a second cycle longer than said first cycle, based on an externally entered chip select signal which indicates a stand-by state or a non-stand-by state, and supplying selected one to said refresh control circuit.

44. The method of controlling as claimed in claim 41, further including the steps of:
   making an activation in response to a predetermined signal; and
   setting a specific address area corresponding to at least one specific area, based on an address signal entered in an activated state.

45. The method of controlling as claimed in claim 44, wherein said step of setting said specific address area includes the steps of:
   judging whether an externally entered command corresponds to a predetermined command for setting a refresh address space;

holding a signal designating an address space for holding data in said stand-by state, based on a result of judgement of said command; and setting a specific address area based on said data as held.

46. The method of controlling as claimed in claim 41, wherein all of said plurality of areas as divided are used as memory cell areas.

47. The method of controlling as claimed in claim 41, wherein in said plurality of areas as divided, at least one area with a bad hold characteristic serve as a redundancy area and is not used as a memory cell area, and a remaining area is used as a memory cell area.

48. The method of controlling as claimed in claim 41, wherein in memory cells in said specific area, all of memory cells having worse hold characteristics than a predetermined criterion are made into redundancy cells and do not serve as memory cells, and remaining cells serve as memory cells.

49. The method of controlling as claimed in claim 41, wherein a first address signal for selecting said memory cells is converted into a second address signal corresponding to said specific area when said first address signal designates an address within a first address area predetermined corresponding to said specific area, and said first address signal is converted into a third address signal included in other area than said specific area when said first address signal designates an address outside said first address area.

50. The method of controlling as claimed in claim 41, wherein if predetermined significant bits of a first address signal for selecting said memory cells is within a first address area predetermined corresponding to said specific area, then an access to said specific area is made by using bits of said first address signal except for said predetermined bits, and if said first address signal is outside of said first address area, then an access to other area than said specific area is made.

51. A semiconductor memory device comprising:
a memory cell array divided into a plurality of areas;
a refresh address generating circuit for generating a refresh address signal;
a selecting circuit for selecting and outputting any one of an address signal and said refresh address signal;
a program circuit for outputting a program signal which decides an area corresponding to an area information included in an address signal selected by said selecting circuit;
an area setting circuit for selecting an area corresponding to said area information in said plurality of areas, based on said selected address signal and said program signal; and
a refresh operation control unit for controlling said selecting circuit to output any one of said address signal and said refresh address signal, and for controlling said refresh address generating circuit to generate a refresh address signal including a specific area information at a first cycle in a stand-by state and also to generate said refresh address signal at a second cycle shorter than said first cycle in a non-stand-by state.

52. The semiconductor memory device as claimed in claim 51, wherein in a non-stand-by state, said refresh operation control unit refreshes said specific area as set in said stand-by state, based on any one of said basic refresh control signal and said specific refresh control signal, and also refreshes other area than said specific area as set in said stand-by state, based on said basic refresh control signal.

53. The semiconductor memory device as claimed in claim 51, wherein said refresh operation control unit refreshes, in said stand-by state, both said at least one kind of specific area and other area based on said basic refresh control signal.

54. The semiconductor memory device as claimed in claim 51, wherein said programmable circuit comprises a circuit having disconnectable fuses.

55. The semiconductor memory device as claimed in claim 51, wherein said programmable circuit is adopted to set, through programming, the number of bits of said output signal in addition to said value of said output signal.

56. The semiconductor memory device as claimed in claim 51, wherein said refresh operation control unit further includes:
a refresh control circuit; and
a timer circuit being electrically coupled to said refresh control circuit for selecting any one of plural clock signals different in cycle from each other, and supplying selected one to said refresh control circuit.

57. The semiconductor memory device as claimed in claim 56, wherein said timer circuit selects any one of a first clock signal with a first cycle and a second clock signal with a second cycle longer than said first cycle, based on an externally entered chip select signal which indicates a stand-by state or a non-stand-by state, and supplying selected one to said refresh control circuit.

58. The semiconductor memory device as claimed in claim 57, wherein said timer circuit comprises:
a high speed timer circuit for outputting a first clock signal;
a low speed timer circuit for outputting a second clock signal; and
a selecting circuit being electrically coupled to said high speed timer circuit and said low speed timer circuit for selecting and outputting any one of said first clock signal and said second clock signal based on said chip select signal.

59. The semiconductor memory device as claimed in claim 51, further including: a specific address area setting unit being activated in response to a predetermined signal, and setting a specific address area corresponding to said at least one specific area, based on an address signal entered in an activated state.

60. The semiconductor memory device as claimed in claim 59, wherein said specific address area setting unit comprises:
a command judging circuit for judging whether an externally entered command for setting a refresh address space corresponds to a predetermined command; and
an address register being electrically coupled to said command judging circuit and a refresh address generating circuit of said refresh operation control unit for supplying said refresh address generating circuit with a signal held based on a result of judgement by said command judging circuit as a signal designating an address space for holding data in said stand-by state.

61. The semiconductor memory device as claimed in claim 51, wherein said plurality of areas as divided have a nonbank configuration, and said specific area setting unit is provided commonly to said plurality of areas.

62. The semiconductor memory device as claimed in claim 51, wherein said plurality of areas as divided have a bank configuration, and said specific area setting unit is provided for each of a plurality of banks.

63. The semiconductor memory device as claimed in claim 51, wherein said specific area is an area determined based on hold characteristics of memory cells.

64. The semiconductor memory device as claimed in claim 63, wherein all of said plurality of areas as divided are used as memory cell areas.

65. The semiconductor memory device as claimed in claim 63, wherein in said plurality of areas as divided, at least one area with a bad hold characteristic serve as a redundancy area and is not used as a memory cell area, and a remaining area is used as a memory cell area.

66. The semiconductor memory device as claimed in claim 63, wherein in memory cells in said specific area, all of memory cells having worse hold characteristics than a predetermined criterion are made into redundancy cells and do not serve as memory cells, and remaining cells serve as memory cells.

* * * * *